Inventor:
PETER DELIVORIAS
BY
W. S. Hill
Agent

INVENTOR.
PETER DELIVORIAS
BY
W. S. Hill
Agent

United States Patent Office 3,461,361
Patented Aug. 12, 1969

3,461,361

COMPLEMENTARY MOS TRANSISTOR INTEGRATED CIRCUITS WITH INVERSION LAYER FORMED BY IONIC DISCHARGE BOMBARDMENT

Peter Delivorias, Finderne, N.J., assignor to Radio Corporation of America, a corporation of Delaware Filed Feb. 24, 1966, Ser. No. 529,825
Int. Cl. H01l *19/00*
U.S. Cl. 317—235 1 Claim

ABSTRACT OF THE DISCLOSURE

A method of making a complementary pair of MOS transistors in a single semiconductor substrate body of one conductivity type silicon by first, forming a region of opposite conductivity type in the body, fabricating transistors having opposite type source and drain regions in the regions of different conductivity types each of these transistors having silicon dioxide gate electrode insulator layers, and, after formation of the silicon dioxide layers, cooling the unit to room temperature in pure, dry oxygen. An inversion layer is formed in the MOS transistor by bombarding the gate insulating layer with an ionic discharge, creating acceptor sites in the insulator.

This invention relates to improved integrated circuits of the monolithic semiconductor type and, more particularly, to circuits which include complementary pairs of MOS transistors.

The MOS transistor is a type of device, operating by flow of majority charge carriers, which comprises closely spaced source and drain electrodes in a substrate layer of single crystal semiconductor material and a conduction channel between the source and drain electrodes. The device also includes a control, or gate electrode, for controlling flow of charge carriers through the channel, comprising a thin film of insulation adjacent the channel and a metal film over the insulating film. Circuit connections are made to the source, drain and gate electrodes.

Because of their relative simplicity of fabrication and their circuit characteristics, MOS transistors are of interest in integrated circuits of the monolithic semiconductor type, especially for computer applications. Digital computer inverter circuits of the Nand gate type may include pairs of MOS transistors of opposite (complementary) types. That is, in each pair of transistors one has an N-type and the other has a P-type channel. It has proved to be a difficult problem to simultaneously fabricate transistors having the desired characteristics of both types. It has been previously suggested to fabricate each type of transistor in a separate island of semiconductor material of appropriate conductivity type and embed these islands in an insulating substrate. However, this procedure can be undesirably high in cost and increases the complexity of the completed unit.

It is an object of the present invention to provide improved circuits of the monolithic semiconductor type which include complementary pairs of MOS transistors.

It is a further object of the invention to provide improved fabrication techniques for the manufacture of integrated circuits which include complementary pairs of MOS transistors in a single semiconductor substrate body.

Figure 1:
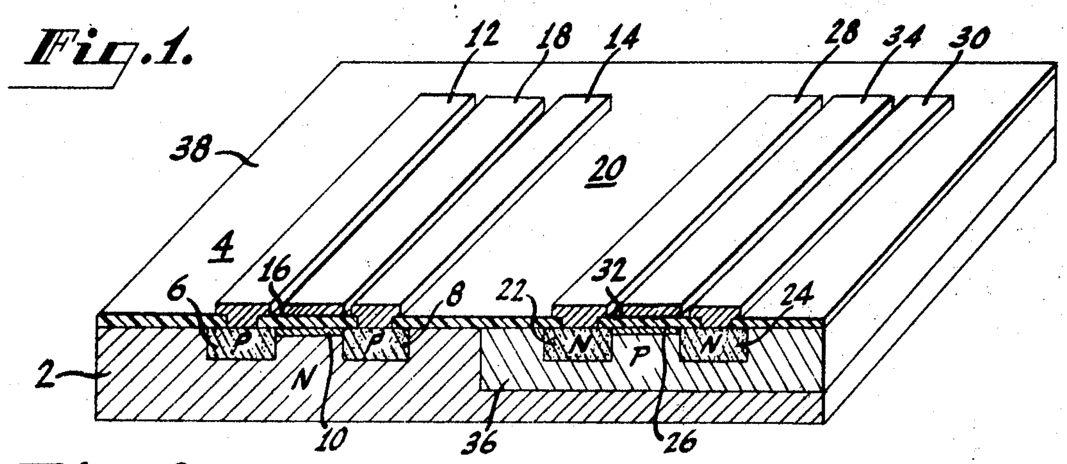
Figure 4:
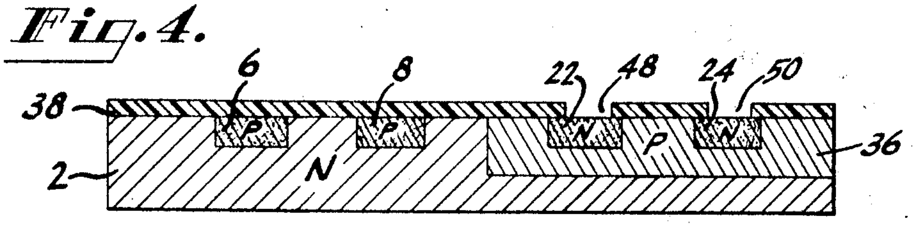
Figure 5:
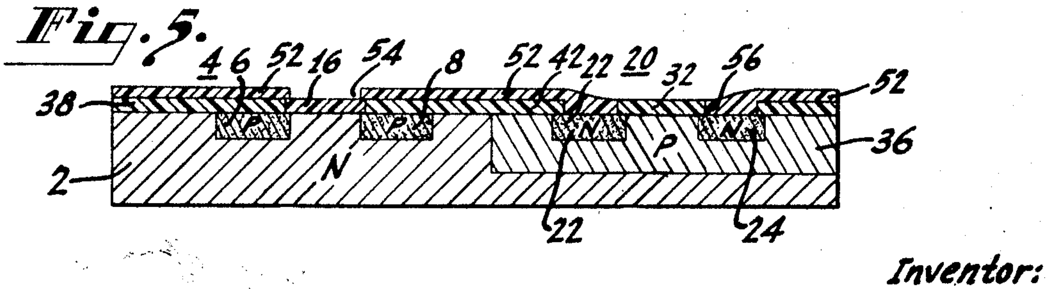
Figures 6, 7, 8, 9, 10, 11:
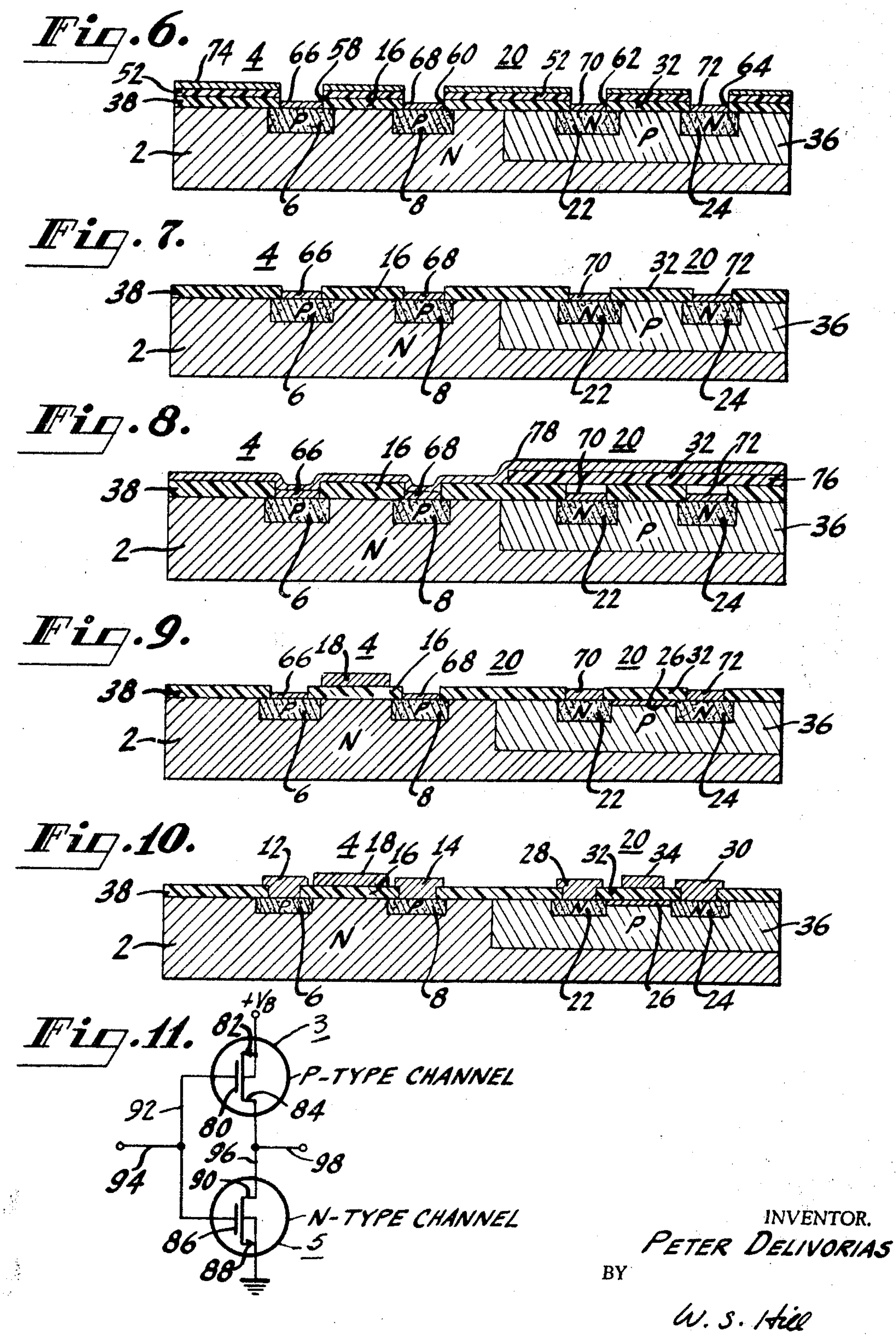

In the drawing, FIGURE 1 is a perspective view of a part of an integrated circuit, including two complementary MOS transistors in accordance with the present invention;

FIGURES 2 to 10 illustrate successive steps in manufacturing the improved circuit portion of FIGURE 1; and FIGURE 11 is a diagram of a simple inverter circuit in which the invention can be utilized.

In brief, one aspect of the present invention is the provision of an integrated circuit of the monolithic semiconductor type comprising a pair of complementary MOS transistors in a single body of semiconductor substrate, the transistors being fabricated in parts of the semiconductor substrate which are of opposite conductivity types. Other aspects of the invention are related to techniques of manufacturing the improved circuit, especially the method of cooling the unit in a stream of pure oxygen after the growth of the gate electrode insulation layers over the channels of the transistors, and ion bombardment of the semiconductor surface prior to depositing metal films where ohmic contact is to be made with the source and drain electrodes.

With reference to FIGURE 1, an improved circuit in accordance with the present invention comprises a semiconductor monocrystal substrate 2 of N conductivity type, having a pair of complementary MOS transistors, one of which, 4, includes a P-type source 6 and a P-type drain 8 connected through a thin P-type accumulation layer channel 10 at the top surface of the semiconductor body. A metal electrode 12 makes ohmic contact to the source electrode 6 and a metal electrode 14 makes ohmic contact to the drain 8. The transistor includes a gate electrode which comprises an insulating oxide layer 16 covering the surface of the semiconductor body 2 over the induced accumulation layer channel 10 and a metal layer 18 superimposed on the insulating layer 16. The accumulation layer actually is not present until a negative bias is placed on the gate electrode 18 since it is only an accumulation of an excess of holes due to repulsion of electrons away from the surface.

The other transistor of the pair comprises a second MOS transistor 20 having an N-type source 22 and an N-type drain 24 connected to a thin N-type inversion layer channel 26 which is at the top surface of the semiconductor body. A metal electrode 28 makes ohmic contact to the source 22 and a metal electrode 30 makes ohmic contact to the drain electrode 24. This transistor also has a gate electrode comprising an insulating oxide layer 32 covering the channel 26 and a metal layer 34 on top of the insulating layer 32. The channel 26 actually extends into the oxide layer 32. The second transistor 20 is contained within a P-type region 36 which extends part way through the semiconductor substrate. The remainder of the portion of the integrated circuit illustrated is protected with an oxide layer 38. The entire integrated circuit may comprise other components (not shown) to which the electrodes of the transistors 4 and 20 are connected, preferably by means of thin stripes of metal (not shown) extending over the oxide layer 38. It will be understood that the source and drain electrodes of one of the transistors may be reversed to make it easier to connect desired pairs of electrodes together in a circuit.

An example of technique for manufacturing the device of FIGURE 1 will now be given. It is assumed that the transistors to be described are enhancement type. Enhancement type MOS transistors are devices which have substantially no channel conduction between source and drain at zero gate bias.

Figure 2:
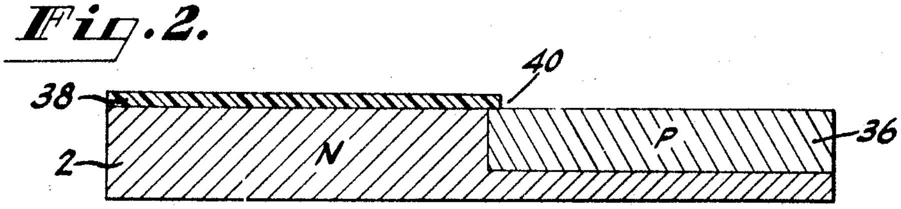

Referring now to FIGURE 2, a chemically polished N-type silicon single crystal wafer 2, 5–7 mils thick, is used as the starting material. Five ohm-centimeter resistivity material is used to advantage. First, a layer of silicon dioxide 38 is thermally grown on the entire top surface of the silicon substrate wafer 2 and an opening 40 is then etched through the oxide where the subsequent P-type diffusion is to occur. The oxide layer may be approximately 5000 A. in thickness, for example. The opening 40 may be etched in the oxide layer using an etching composition such as the buffered etch composed of ammonium fluoride, hydrogen fluoride and water. A conventional photoresist and conventional exposure techniques are used to define the area of the opening. Beneath the opening 40, a P-type region 36 is formed by diffusing boron into the N-type substrate wafer 2.

The boron is diffused into the wafer in a two-step process. First, boron is deposited on the silicon at 800° C. for thirty minutes from a boron nitride source using nitrogen as the carrier gas. A flow of oxygen is included to protect the silicon surface and to aid the formation of boron tri-oxide. The boron tri-oxide is reduced to elemental boron which then diffuses into the substrate wafer 2. After 30 minutes, the diffusion is stopped and a portion of the oxide layer 38 is stripped off in order to remove boron which has diffused into the oxide layer and which later could diffuse completely through the layer causing unwanted areas of boron diffusion in the substrate wafer. It is sufficient to strip off about 1000 A. of the oxide layer with the same buffered etch that was used to open up the hole 40 prior to boron diffusion.

The second step in the boron diffusion is then carried out at 1200° C. in a dry oxygen atmosphere for 16 hours. This drives the boron further into the silicon and provides a P-type region with a surface concentration of boron of about $4.6 \times 10^{16}$ atoms per $cm.^3$. A P–N junction is formed about 6 microns beneath the surface of the substrate wafer 2 and this junction has reverse breakdown of the order of 150 volts at less than 10 microamperes. Resistivity of the P-type region 36 is about 1 ohm cm. within the depth to which source and drain regions are to be formed.

Figure 3:
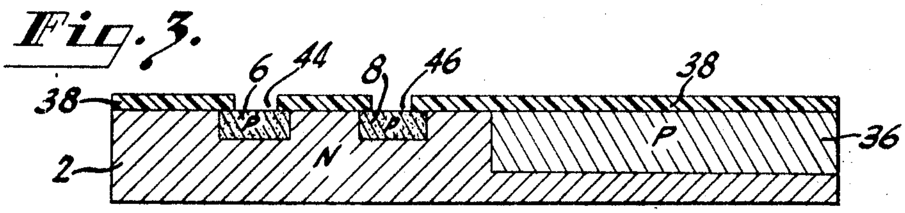

Referring to FIGURE 3, the portion of the oxide layer 38 which was removed to form the P-type region 36 is now replaced with a layer of thermally-grown silicon dioxide 38 about 7000–7500 A. thick and new openings 44 and 46 are etched through the oxide layer 38 with conventional photoresist and etching techniques. The openings 44 and 46 are to be utilized for diffusing in impurities to form the source and drain electrode regions, respectively, of an MOS transistor 4 as shown in FIGURE 1. Source region 6 and drain region 8 are formed by depositing boron nitride through the openings 44 and 46 and diffusing boron into the substrate wafer 2 at 1100° C. for 20 minutes. Under this condition, the surface concentration of boron is about $2 \times 10^{20}$ atoms per $cm.^3$. The adjacent edges of the source and drain regions are 0.39 to 0.41 mil apart in this example.

Referring to FIGURE 4, the openings 44 and 46 in the silicon oxide layer 38 are closed against with oxide and new openings 48 and 50 are etched into the oxide layer portion 38 within the area of the P-type region 36. Phosphorous oxychloride is then used to deposit phosphorous within the openings 48 and 50, and the phosphorous is diffused into the P-type region 36 to form N-type source and drain regions 22 and 24, respectively. The diffusion is carried out at 1050° C. Adjacent edges of the source and drain regions are again 0.39 to 0.41 mil apart.

The next step, illustrated in FIGURE 5, in the fabrication process is to build up the oxide insulation layer over the channel region of each transistor. This process must be carefully controlled since on it depends to a large extent the degree of passivation of the devices, gate capacitance, characteristics of channel modulation, input resistance, and over all reliability of the devices. A preferred way to build up the channel oxide, in accordance with the present invention, is to first thermally grow silicon dioxide to a thickness of about 500 A. This is done by first covering the entire previously-deposited oxide with photo-resist 52 and, by conventional methods, opening holes 54 and 56 in the photoresist 52 and the oxide layer 38 where the channel oxide is to be fabricated. Thus, the previously-deposited oxide is removed over the channel areas. Then dry oxygen is passed over the unit at 1000° C. until a thick layer of oxide forms. In transistor 4 the completed oxide layer is designated 16 and in transistor 20 it is designated 32. Then a second layer of oxide 200 A. thick is deposited. This is done by passing a gaseous mixture over the unit at a temperature of 745° C. Silicon dioxide is supplied by decomposition of tetraethylorthosilane. The silicon dioxide layer which is deposited is doped with phosphorous by decomposing trimethylphosphate vapor which is also a part of the mixture. Argon is used as a carrier gas. Before the entire 200 A. thick layer has been deposited, the flow of trimethylphosphate is cut off and silicon dioxide, alone, is deposited.

Without the doped layer of oxide, it has been found, the ionic mobility of the first layer is too high at elevated temperature and this leads to formation of an uncontrolled channel inversion layer in the N-type transistor 20.

The top layer of undoped silicon dioxide has been found to inhibit undercutting when the unit is subsequently covered with photoresist and etched.

Finally, an additional layer of undoped, thermally grown silicon dioxide is grown at 1000° C. This layer is about 100 A. thick. This final layer not only increases the total thickness of the oxide layer and reduces the probability of pinholes being present which extend entirely through the layers, it appears to densify the previously-deposited layers, probably by increasing the number of cross-linking bonds between the atoms.

A control of device characteristics has been achieved in the present invention by subjecting the oxidized surface, after the first oxidizing step and, again, after the final oxidizing step, to a particular type of cooling treatment. The cooling to room temperature at a rate of 100° C./$\mu$m. is carried out entirely in a stream of pure, dry (below −65° C. and above −100° C.) oxygen. This treatment minimizes the introduction of ions from the water vapor of the atmosphere and thus greatly reduces the tendency of these ions to adversely affect device characteristics.

Referring now to FIGURE 6, the entire surface of the unit is covered with additional photoresist 52 and, by conventional techniques, openings 58 and 60 are etched through the layers of photoresist 52 and oxide 38 to expose the surfaces of source and drain regions 6 and 8, respectively. In like manner, openings 62 and 64 are opened to expose the source and drain regions 22 and 24, respectively. The exposed surfaces of the sources and drains of the two transistors are now subjected to ion bombardment in argon gas for about 10 minutes. The wafer is placed in a vacuum chamber which is provided with discharge electrodes. The chamber is pumped down to a pressure of about $10^{-2}$ mm. of mercury and then back-filled with argon gas to a pressure of 50 microns. This pressure may be from 20–50 microns, for example. A potential difference of 800 volts DC is then placed across the discharge electrodes and the exposed wafer surfaces are subjected to a glow discharge at about room temperature for 1–30 minutes. This modifies the exposed source and drain surfaces such that better adherence of aluminum, which is to be used as a contact metal, is obtained. This discharge is stopped, the argon gas is removed from the chamber and the chamber is pumped down to the high vacuum without breaking the vacuum. Aluminum metal is then evaporated over the entire surface of the unit, forming a layer about 1500 A. thick. This aluminum forms an ohmic contact layer 66 on source region 6, a contact layer 68 on drain region 8, a contact layer 70 on source region 22, and a contact layer 72 on drain region 24. An aluminum layer 74 also covers the remainder of the circuit area.

The next step is to remove all excess aluminum, which comprises the layer 74, and all of the excess photoresist 52 so that there remains, as shown in FIGURE 7, only that part of the aluminum which comprises the aluminum contact layers over the sources and drains of the two transistors.

The transistor 20, including the aluminum contact layers 70 and 72, is covered with a layer of photoresist 76. The assembly is now subjected to an ion bombardment similar to the first bombardment to increase the adherence of additional aluminum to be deposited on source 66 and drain 68 of transistor 4. A layer of aluminum 78 is then evaporated over all to cover the entire surface of the unit. This is illustrated in FIGURE 8. With additional photoresist and etching, as shown in FIGURE 9, the metal gate strip 18 is defined over the channel oxide layer 16 of transistor 4. After removal of excess photoresist, the units are now subjected to a temperature of 550° C. in a nitrogen atmosphere for 3 minutes in order to cause alloying of the aluminum on the source and drain electrodes to the silicon. This step has been found to improve the ohmic contacts with the aluminum layers 70 and 72 of the N-type unit 20, and of the aluminum layers 66 and 68 of the P-type unit, and also helps to establish the electrical characteristics of the P-type transistor 4. After the alloying step, the P-type transistor 4 has a typical $G_m$ of 600–800 micromhos of one milliamp of drain current and a threshold voltage $V_{th}$ of $-4\frac{1}{2}$ to $-6\frac{1}{2}$ volts. When the heating step is omitted units have had a typical $G_m$ of 100 at 0.5 ma. and a $V_{th}$ of $-9$ to $-11$.

The unit is now subjected to a third ion bombardment similar to the first two bombardments. This treatment helps to establish the characteristics of the N-type device. Ions impinging on the channel oxide 32 of the N-type transistor 20 create acceptor sites in the oxide. Acceptor sites at the interface between the oxide and the silicon body draw electrons from the body toward the interface thus forming an N-type inversion layer 26 on the P-type region.

A layer of aluminum (not shown) is now evaporated over the entire wafer and, by means of conventional photoresist techniques, the aluminum is removed except (as shown in FIG. 10) for the contact strips 12 and 14 over the source and drain regions of P-type transistor 4, gate contact strip 18 over the oxide layer 17 of the P-type unit, contact strips 28 and 31 over the source and drain regions of the N-type unit 20, and the gate contact strip 34 of the N-type unit. Typical device characteristics are a $G_m$ of 600–800 micromhos and a threshold voltage $V_{th}$ of $+\frac{1}{2}$ to $+2\frac{1}{2}$ volts.

A transistor pair, such as shown in FIGURE 1, may be utilized in a computer inverter circuit as shown in FIGURE 11. This circuit includes a P-type channel transistor 3 and an N-type channel transistor 5. The transistor 3 has a gate electrode 80, a source electrode 82, and a drain electrode 84. The transistor 5 has a gate electrode 86, a source electrode 88, and a drain electrode 90. The two gate electrodes 80 and 86 are connected with a lead 92 which is in turn connected to a signal input lead 94. The two drain electrodes 84 and 90 are also connected together through a lead 96 which is in turn connected to an output lead 98. The source electrode 88 is grounded. The source electrode 82 is connected to $+V_b$. The N-substrate is returned to the most positive point $+V_b$ and the P-substrate is connected to ground.

In steady state operation, with $+V_b$ connected to the source of the P channel unit, and the source of N channel unit connected at ground, if the input digital signal level has a value of $+V_b$ volts, the input capacitance $C_{in}$ is charged to $+V_b$ volts. The gate-to-source voltage of the P-type channel transistor 3 is substantially 0 volt, thereby biasing this transistor into cutoff. The gate-to-source voltage of the N-type transistor 5 has a value of $+V_b$ volts, thereby tending to bias the N-type transistor into a fully conductive condition. Consequently, the output 98 is at a digital level of substantially 0 volt.

On the other hand, when the input voltage is at 0 volt, the input capacitance $C_{in}$ is charged to 0 volt. The gate-to-source voltage of the P-type channel transistor 3 is substantially $-V_b$ volts, and the gate-to-source voltage of the N-type channel transistor 5 is at substantially 0 volt. Thus, the P-type channel transistor 3 is biased to a fully conductive condition and the N-type channel transistor 5 is biased to cutoff. For this condition, the output 98 is at a digital level of approximately $V_b$ volts. Consequently, this circuit provides at its output 98 an inversion of the digital levels $+V_b$ volts or 0 volt which are applied to the input 94.

Variations are possible in the example which has been described. The resistivity of the substrate wafer should be just high enough to avoid punch through between source and drain. Resistivities within the range of 1–20 ohms are suitable, for example.

Instead of starting with an N-type wafer, a P-type wafer may be used and the region 36 will then be N-type and the conductivity types of the source and drain regions of the two transistors will be the reverse of that illustrated. Also, the semiconductor material may be other than silicon: germanium or gallium arsenide, for example.

The impurities used to form the diffused regions may also be different from those given in the example. Any other conventional P-type impurity may be used for the P-type regions and any other conventional N-type impurity may be used for the N-type regions.

The ionic discharge treatment may be carried out in any inert gas such as argon, helium or neon. The discharge may be either AC or DC.

To make the ohmic contacts after the discharge treatment, metals other than aluminum may be used.

The circuit portion illustrated could also be fabricated in a thin film of semiconductor material deposited as a single crystal layer on an appropriate insulating substrate. This would decrease switching time and decrease power dissipation.

What is claimed is:

1. In a monolithic type semiconductor integrated circuit, a silicon semiconductor substrate body having a first portion of N-type conductivity, a first MOS transistor with P-type source and drain electrodes disposed in said portion, said body also having a second portion of P-type conductivity, a second MOS transistor having N-type source and drain regions disposed in said second portion, said second transistor having a gate electrode between its source and drain electrodes which includes a silicon dioxide insulating layer on said substrate body, electron acceptor sites in said oxide layer created by the presence of ions introduced in said layer by ionic discharge bombardment, said acceptor sites being sufficient to attract electrons from said substrate toward the interface between said substrate and said oxide layers, and an N-type inversion layer which includes said electrons disposed at said interface.

References Cited

UNITED STATES PATENTS

| | | | |
|---|---|---|---|
| 3,356,858 | 12/1967 | Waulass | 317—235 |
| 2,750,541 | 6/1956 | Ohl | 317—235 |
| 3,151,004 | 9/1964 | Glicksman et al. | 148—33.3 |
| 3,246,173 | 4/1966 | Silver | 307—88.5 |
| 3,293,084 | 12/1966 | McCaldin | 148—1.5 |
| 3,323,947 | 6/1967 | Kahng et al. | 117—213 |
| 3,328,210 | 6/1967 | McCaldin et al. | 148—1.5 |
| 3,329,601 | 7/1967 | Mattox | 204—298 |

JOHN W. HUCKERT, Primary Examiner

R. SANDLER, Assistant Examiner

U.S. Cl. X.R.

29—571; 317—101